United States Patent
Moon

(10) Patent No.: US 8,233,343 B2
(45) Date of Patent: Jul. 31, 2012

(54) SENSE AMPLIFIER AND SEMICONDUCTOR INTEGRATED CIRCUIT USING THE SAME

(75) Inventor: Jin Yeong Moon, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 177 days.

(21) Appl. No.: 12/648,340

(22) Filed: Dec. 29, 2009

(65) Prior Publication Data

US 2010/0329056 A1  Dec. 30, 2010

(30) Foreign Application Priority Data

Jun. 30, 2009  (KR) .................. 10-2009-0058933

(51) Int. Cl.
  *G11C 7/00* (2006.01)
  *G11C 7/02* (2006.01)

(52) U.S. Cl. ....................... 365/203; 365/207

(58) Field of Classification Search .................. None
See application file for complete search history.

(56) References Cited

U.S. PATENT DOCUMENTS

| 5,754,488 A | * | 5/1998 | Suh ............................... 365/205 |
| 6,288,950 B1 | | 9/2001 | Koike |
| 6,304,505 B1 | | 10/2001 | Forbes et al. |
| 2006/0023534 A1 | | 2/2006 | Do |
| 2006/0092735 A1 | | 5/2006 | Do et al. |
| 2009/0147596 A1 | * | 6/2009 | Shiah ....................... 365/189.11 |

FOREIGN PATENT DOCUMENTS

| JP | 2006-031922 A | 2/2006 |
| KR | 100167673 B1 | 9/1998 |
| KR | 2003-0056465 A | 7/2003 |

* cited by examiner

*Primary Examiner* — Hoai V Ho
*Assistant Examiner* — James G Norman
(74) *Attorney, Agent, or Firm* — Ladas & Parry LLP

(57) ABSTRACT

A sense amplifier resistant to malfunctions associated with offsets in inverter pairs is presented. The sense amplifier includes inverter pairs and a controller. Any one input terminal of the inverter pairs is electrically connected to a bit line and the other one input terminal is electrically connected to a /bit line. The controller is configured to precharge the bit line and the /bit line to a level corresponding to an offset of the inverter pairs in response to a first control signal. The controller senses a voltage difference of the bit line and the /bit line using the inverter pairs by connecting output terminals of the inverter pairs to the bit line pairs in response to a second control signal.

23 Claims, 2 Drawing Sheets

US 8,233,343 B2

SENSE AMPLIFIER AND SEMICONDUCTOR INTEGRATED CIRCUIT USING THE SAME

CROSS-REFERENCES TO RELATED PATENT APPLICATION

The present application claims priority under 35 U.S.C 119(a) to Korean Application No. 10-2009-0058933, filed on Jun. 30, 2009, in the Korean Intellectual Property Office, which is incorporated herein by reference in its entirety as set forth in full.

BACKGROUND

1. Technical Field

Embodiments of the present invention described herein relate to a semiconductor circuit technology, and in particular, to a sense amplifier and a semiconductor integrated circuit using the same.

2. Related Art

A semiconductor integrated circuit 10 according to the conventional art includes a bit line 'BL', a /bit line 'BLB', a word line 'WL', a memory cell 11, a sense amplifier 12, and precharge circuits 13 and 14, as shown in FIG. 1.

The sense amplifier 12, which is a component for sensing and amplifying data recorded in the memory cell 11, is electrically connected between the bit line 'BL' and the /bit line 'BLB' and includes a plurality of transistors 'M1 to M6'.

The sense amplifier 12, which is in a cross coupled latch form, includes inverter pairs that are configured of transistors M1 and M2 and transistors M3 and M4.

The transistor 'M5' is electrically connected between the cross coupled latch and a power supply terminal 'VCORE'. A gate of the transistor 'M5' receives a control signal 'SAP'. The transistor 'M6' is electrically connected between the cross coupled latch and a ground terminal 'VSS'. A gate of the transistor 'M6' receives a control signal 'SAN'. The control signals 'SAP and SAN' are signals that determine a timing supplying power to the sense amplifier 12.

The precharge circuits 13 and 14 precharge the bit line pairs to a bit line precharge voltage 'VBLP' level according to a bit line equalize signal 'BLEQ'. The precharge circuits 13 and 14 may be configured of a plurality of transistors 'M7 to M12'.

At this time, a mismatch between the transistors that configure the inverter pairs of the sense amplifier 12 may occur due to a problem of the elements or processes. An offset between the transistors forming the inverter pair, that is, a difference in a threshold voltage that is different from a circuit design may occur due to the mismatch.

In addition, since the transistors 'M5 and M6' and the transistors 'M7 to M12' configuring the precharge circuits 13 and 14 are a component that has a connection with a power supply, they are designed at a larger size than the transistors 'M1 to M4' configuring the inverter pairs of the sense amplifier 12.

The semiconductor integrated circuit according to the conventional art, which is configured as described above, precharges the bit line 'BL' and the /bit line 'BLB' at the bit line precharge voltage 'VBLP' level by the precharge circuits 13 and 14 before the word line 'WL' is activated.

Thereafter, as the word line 'WL' is activated for read or refresh operations, the charge sharing of the bit line 'BL' and the /bit line 'BLB' is made.

After a time elapses by a degree that the voltage difference of the bit line 'BL' and the /bit line 'BLB' is the desired level or more by the charge sharing, the control signals 'SAP and SAN' are activated.

The sense amplifier 12 is operated according to the activation of the control signals SAP and SAN, such that the sensing and amplifying operations of data recorded in the memory cell 1 can be made.

The semiconductor integrated circuit according to the above-mentioned conventional art has the following problems.

First, the bit line 'BL' and the /bit line 'BLB' are precharged at the same voltage level, that is, the bit line precharge voltage 'VBLP' level. However, the sense amplifier does not reflect the voltage difference of the bit line 'BL' and the /bit line 'BLB' due to the offset of the inverter pairs and thus, a malfunction may occur.

For example, it is assumed that "1" is recorded in the memory cell 11. When the word line 'WL' is activated, the voltage level of the bit line 'BL' is higher than the bit line precharge voltage 'VBLP' and the voltage level of the /bit line 'BLB' will maintain the bit line precharge voltage 'VBLP'. At this time, if it is assumed that the threshold voltage of the transistor 'M2' is in a lower state than that of the design and the threshold voltage of the transistor 'M4' is in a higher state than that of the design, the voltage of the bit line 'BL' is discharged through the transistor 'M6' by the transistor 'M2' such that the data of the memory cell 11 is wrongly sensed as "0".

Second, since the transistors 'M5 and M6' for supplying power and the transistors 'M7 to M12' for the precharge operation are needed, the reduction in the circuit area to form the transistors occurs.

SUMMARY

In one embodiment of the present invention a sense amplifier includes: inverter pairs of which any one input terminal is electrically connected to a bit line and the other input terminal is electrically connected to a /bit line; and a controller configured to precharge the bit line and the /bit line to a level corresponding to an offset of the inverter pairs in response to a first control signal and to sense a voltage difference of the bit line and the /bit line by the inverter pairs by electrically connecting output terminals of the inverter pairs to the bit line pairs in response to a second control signal.

In another embodiment of the present invention, a sense amplifier includes: a first inverter and a second inverter that are electrically connected between a bit line and a /bit line and forms a cross coupled latch; a first transistor that is configured to connect an input terminal of the first inverter to an output terminal thereof in response to a first control signal; a second transistor that is configured to connect an input terminal of the second inverter to an output terminal thereof in response to the first control signal; a third transistor that is configured to connect the output terminal of the first inverter to the /bit line in response to a second control signal; and a fourth transistor that is configured to connect the output terminal of the second inverter to the bit line in response to the second control signal.

In still another embodiment of the present invention, a semiconductor integrated circuit includes: a memory cell; bit line pairs configured of a bit line and a /bit line that are connected to input and output data to the memory cell; and an amplifying sensor configured to include inverter pairs connected between the bit line pairs, precharge the bit line and the /bit line to a level corresponding to an offset voltage of the inverter pairs in response to a first control signal, and sense a voltage difference of the bit line and the /bit line by the inverter pairs by connecting the output terminals of the inverter pairs to the bit line pairs in response to the second control signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Hereinafter, preferred embodiments will be described in more detail with reference to the accompanying drawings.

Figure 1:
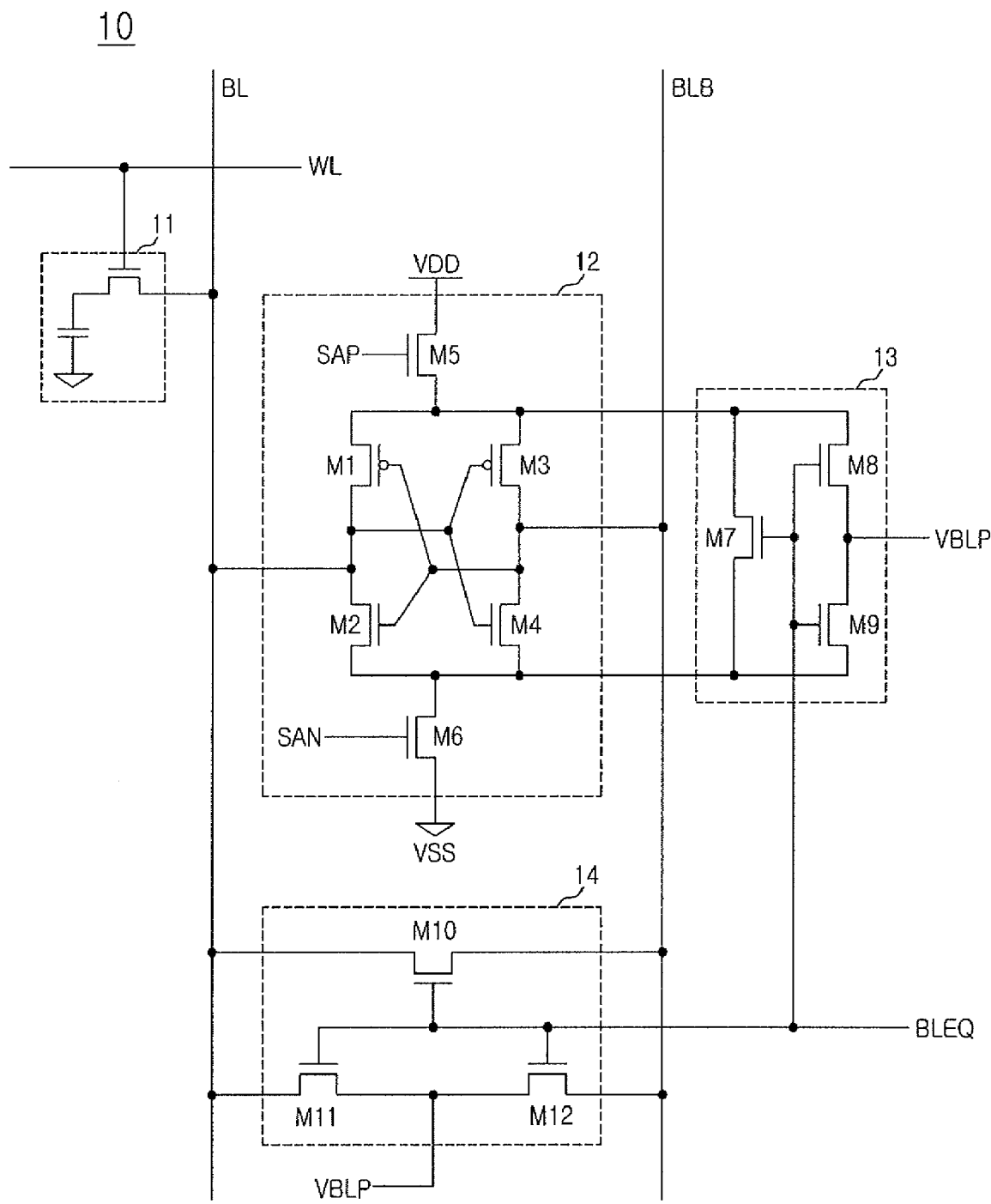
FIG. 1 is a circuit diagram of a semiconductor integrated circuit according to the conventional art.
Figure 2:
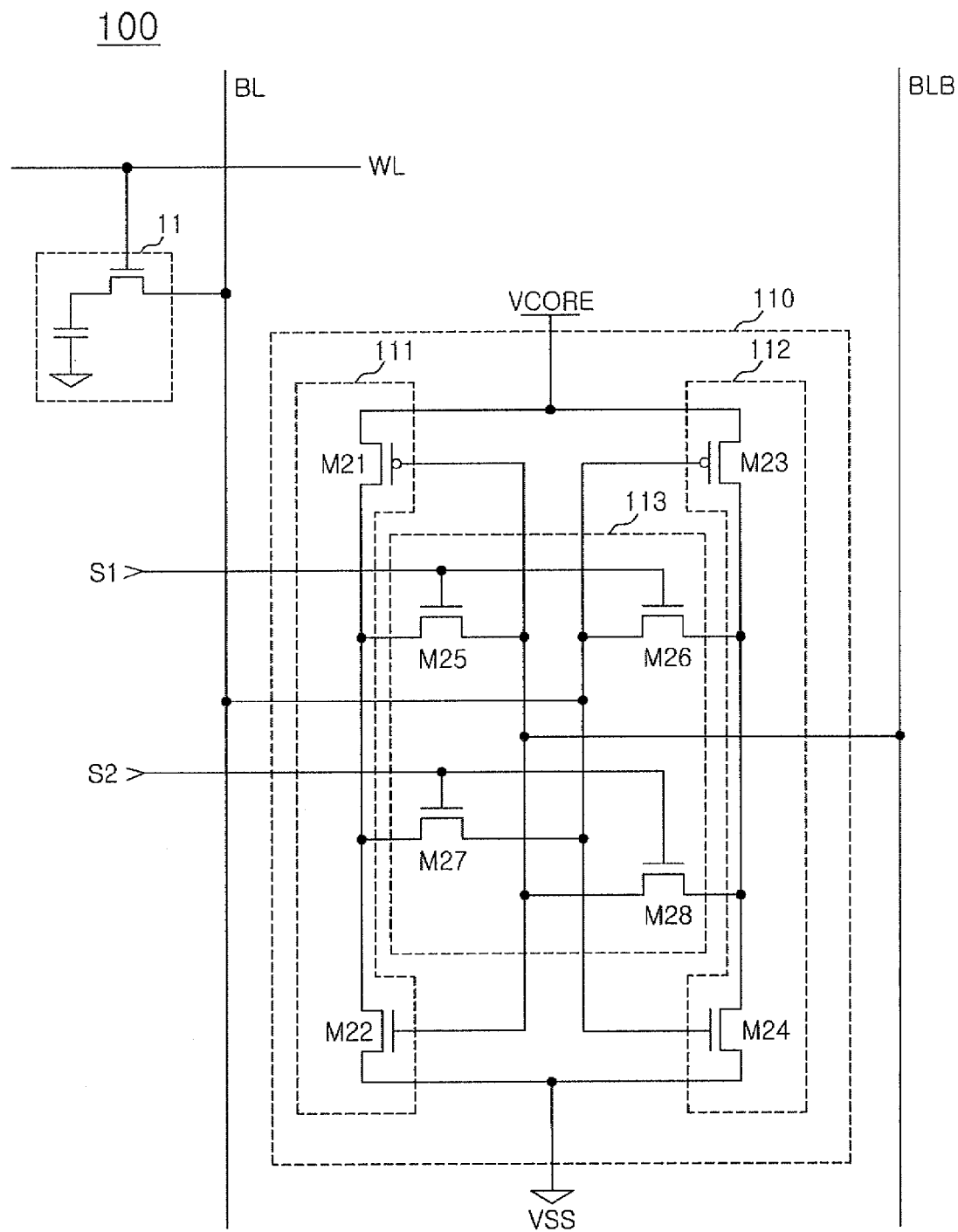
FIG. 2 is a circuit diagram of a semiconductor integrated circuit according to the embodiment of the present invention.

FIG. 2 is a circuit diagram of a semiconductor integrated circuit according to the embodiment.

As shown in FIG. 2, a semiconductor integrated circuit 100 according to the present invention includes bit line pairs that are configured of a bit line 'BL' and a /bit line 'BLB', a memory cell 11, and a sense amplifier 110.

The sense amplifier 110 is electrically connected between the bit line 'BL' and the /bit line 'BLB' and is applied with a power supply voltage 'VCORE' and a ground voltage 'VSS'.

The sense amplifier 110 commonly uses the power supply voltage 'VCORE' for precharging the bit line pairs and sensing the voltage difference of the bit line pairs (sense data recorded in the memory cell).

The sense amplifier 110 includes a first inverter 111, a second inverter 112, and a controller 113.

The first inverter 111 includes fifth and sixth transistors 'M21 and M22'. The source of the fifth transistor 'M21' is applied with the power supply voltage 'VCORE' and the drain of the sixth transistor 'M22' is applied with the ground voltage 'VSS'.

The second inverter 112 includes seventh and eighth transistors 'M23 and M24'. The source of the seventh transistor 'M23' is applied with the power supply voltage 'VCORE' and the drain of the eighth transistor 'M24' is applied with the ground voltage 'VSS'.

The fifth to eighth transistors 'M21 to M24' of the first and second inverters 111, 112 form a structure of a cross coupled latch.

The controller 113 is configured to precharge the bit line 'BL' and the /bit line 'BLB' to a level corresponding to an offset of the inverter pairs 111 and 112 in response to a first control signal 'S1' and sense a voltage difference of the bit line 'BL' and the /bit line 'BLB' using the inverter pairs 111 and 112 by connecting output terminals of the inverter pairs 111 and 112 to the bit line pairs 'BL and BLB' in response to a second control signal 'S2'.

The first control signal 'S1' is a pulse signal that is generated prior to a setting time from activation timing of a word line driving signal, that is, a signal for activating the word line. It is possible to use a bit line equalize signal as the first control signal 'S1'.

The second control signal 'S2' is a signal that delays the word line driving signal by a predetermined setting time. It is possible to use the word line driving signal as the second control signal 'S2'.

The controller 113 includes fifth to eighth transistors 'M25 to M28'.

The first transistor 'M25' is configured to connect the input terminal and output terminal of the first inverter 111 in response to the first control signal 'S1'.

The second transistor 'M26' is configured to connect the input terminal and output terminal of the second inverter 112 in response to the first control signal 'S1'.

The third transistor 'M27' is configured to connect the output terminal of the first inverter 111 to the bit line 'BL' in response to the second control signal 'S2'.

The fourth transistor 'M28' is configured to connect the output terminal of the second inverter 112 to the /bit line 'BLB' in response to the second control signal 'S2'.

The operation of the semiconductor integrated circuit configured as above according to the present invention will be described below.

The first control signal 'S1' is generated prior to the activation timing of the word line driving signal. At this time, the second control signal 'S2' is in a non-activated state.

The first and second transistors 'M25 and M26' are in a turn-on state and the third and fourth transistors 'M27 and M28' are in a turn-off state, during a high level interval of the first control signal 'S1'.

Therefore, the output terminal of the first inverter 111 is electrically separated from the bit line 'BL', while the output terminal and input terminal of the first inverter 111 are short from each other and the input terminal of the first inverter 111 is connected to the /bit line 'BLB'. Therefore, the offset of the first inverter 111, that is, the voltage level reflecting the difference between a target threshold voltage and an actual threshold voltage is stored in an effective capacitor of the /bit line 'BLB' to precharge the /bit line 'BLB'.

At this time, the effective capacitor does not form an actual circuit configuration, but includes the gate capacitance of all the transistors connected to the /bit line 'BLB', etc.

Likewise, the output terminal of the second inverter 112 is electrically separated from the /bit line 'BLB', while the output terminal and input terminal of the second inverter 112 are short from each other and the input terminal of the second inverter 112 is connected to the bit line 'BL'. Therefore, the offset of the second inverter 112, that is, the voltage level reflecting the difference between a target threshold voltage and an actual threshold voltage is stored in an effective capacitor of the bit line 'BL' to precharge the bit line 'BL'.

At this time, the precharge voltage level of the bit line 'BL' and the precharge voltage level of the /bit line 'BLB' have a difference due to the offset of the first inverter 111 and the second inverter 112. In other words, the bit line 'BL' and the /bit line 'BLB' are precharged at a level to compensate for the offset in order to prevent malfunction upon sensing the voltage difference of the bit line 'BL' and the /bit line 'BLB'.

Thereafter, as the word line 'WL' is activated in response to the activation of the word line driving signal, the charge sharing of the bit line 'BL' and the /bit line 'BLB' is made.

After a predetermined time elapses such that the voltage difference of the bit line 'BL' and the /bit line 'BLB' is the desired level or more by charge sharing, the second control signal 'S2' is activated. At this time, the first control signal 'S1', which is a pulse form, is in a previously non-activated state prior to the activation timing of the word line driving signal.

Therefore, the first and second transistors 'M25 and M26' maintain the turn-off state and the third and fourth transistors 'M27 and M28' are turned-on.

As the third and fourth transistors 'M27 and M28' are turned-on, the output terminal of the first inverter 111 is electrically connected to the bit line 'BL' and the output terminal of the second inverter 112 is electrically connected to the /bit line 'BLB' to perform the operation of sensing data recorded in the memory cell 11, that is, the operation of sensing the voltage difference of the bit line 'BL' and the /bit line 'BLB'.

While certain embodiments have been described above, it will be understood to those skilled in the art that the embodiments described are by way of example only. Accordingly, the apparatus described herein should not be limited based on the described embodiments. Rather, the right scope of the present invention is defined only by the claims. All modifications and changes derived from the meanings, scope, and equivalents of claims should be construed as being included in the scope of the present invention.

What is claimed is:

1. A sense amplifier, comprising:
   inverter pairs of which any one input terminal is electrically connected to a bit line and the other input terminal is electrically connected to a /bit line; and
   a controller configured to precharge the bit line and the /bit line to a level corresponding to an offset of the inverter pairs in response to a first control signal and to sense a voltage difference of the bit line and the /bit line by the inverter pairs by electrically connecting output terminals of the inverter pairs to the bit line pairs in response to a second control signal,
   wherein the inverter pairs are cross coupled together to form a latch.

2. The sense amplifier of claim 1, wherein it is configured to perform the precharge of the bit line and the /bit line by using a power supply voltage for driving the inverter pairs.

3. The sense amplifier of claim 1, wherein the first control signal includes a pulse signal that is generated prior to the activation of a word line driving signal.

4. The sense amplifier of claim 1, wherein the first control signal includes a bit line equalize signal.

5. The sense amplifier of claim 1, wherein the second control signal includes a word line driving signal.

6. The sense amplifier of claim 1, wherein the second control signal includes a signal that delays the word line driving signal by a setting time.

7. A sense amplifier comprising:
   first and second inverters electrically coupled to a bit line and to a /bit line, the first and second inverters cross coupled together to form a latch;
   a first transistor configured to connect to an input terminal of the first inverter to an output terminal thereof and the /bit line in response to a first control signal;
   a second transistor configured to connect an input terminal of the second inverter to an output terminal thereof and the bit line in response to the first control signal;
   a third transistor configured to connect the output terminal of the first inverter to the bit line in response to a second control signal; and
   a fourth transistor configured to connect the output terminal of the second inverter to the /bit line in response to the second control signal.

8. The sense amplifier of claim 7, wherein the first control signal includes a bit line equalize signal.

9. The sense amplifier of claim 7, wherein the second control signal includes a word line driving signal.

10. The sense amplifier of claim 7 wherein the first through fourth transistors comprise a controller.

11. The sense amplifier of claim 7 wherein the first inverter comprises
    a fifth transistor having a source coupled to a power supply voltage, and a gate coupled to the first transistor; and
    a sixth transistor having a drain coupled to a ground voltage, a gate coupled to the third transistor, and a source coupled to a drain of the fifth transistor.

12. The sense amplifier of claim 7 wherein the second inverter comprises
    a seventh transistor having a source coupled to a power supply voltage, and a gate coupled to the second transistor; and
    an eighth transistor having a drain coupled to a ground voltage, a gate coupled to the fourth transistor, and a source coupled to a drain of the seventh transistor.

13. The sense amplifier of claim 7, wherein the first control signal is a pulse signal that is generated prior to a setting time for activating a word line.

14. The sense amplifier of claim 7, wherein the second control signal delays the word line driving signal by a predetermined setting time.

15. The sense amplifier of claim 7, wherein the first and second transistors are in a turn-on state and the third and fourth transistors are in a turn-off state, during a high level interval of the first control signal.

16. The sense amplifier of claim 7, wherein the output terminal of first inverter is electrically separated from the bit line while the output and input terminals of the first inverter are shorted together and the input terminal of the first inverter is connected to the /bit line wherein a voltage level reflecting an offset of the first inverter is stored in an effective capacitor of the /bit line to precharge the /bit line.

17. The sense amplifier of claim 7, wherein the output terminal of second inverter is electrically separated from the /bit line while the output and input terminals of the second inverter are shorted together and the input terminal of the first inverter is connected to the bit line wherein a voltage level reflecting an offset of the first inverter is stored in an effective capacitor of the bit line to precharge the bit line.

18. The sense amplifier of claim 7, further comprising a memory cell coupled to the bit line and to the /bit line.

19. A semiconductor integrated circuit, comprising:
    a memory cell;
    bit line pairs configured as a bit line and a /bit line that are electrically connected to input and output data to the memory cell; and
    an amplifying sensor configured to include inverter pairs connected between the bit line pairs, precharge the bit line and the /bit line to a level corresponding to an offset voltage of the inverter pairs in response to a first control signal, and sense a voltage difference of the bit line and the /bit line using the inverter pairs by connecting the output terminals of the inverter pairs to the bit line pairs in response to the second control signal,
    wherein the inverter pairs are cross coupled together to form a latch.

20. The semiconductor integrated circuit of claim 19, wherein the precharge of the bit line and the /bit line is performed by using the power supply voltage for driving the inverter pairs.

21. The semiconductor integrated circuit of claim 19, wherein the first control signal includes a bit line equalize signal.

22. The semiconductor integrated circuit of claim 19, wherein the second control signal includes a word line driving signal.

23. The semiconductor integrated circuit of claim 19, wherein the inverter pairs are coupled between a power source voltage and a ground.

* * * * *